United States Patent [19]
Miller

[11] Patent Number: 5,305,362
[45] Date of Patent: Apr. 19, 1994

[54] SPUR REDUCTION FOR MULTIPLE MODULATOR BASED SYNTHESIS

[75] Inventor: Brian M. Miller, Liberty Lake, Wash.

[73] Assignee: Hewlett-Packard Company, Palo Alto, Calif.

[21] Appl. No.: 989,811

[22] Filed: Dec. 10, 1992

[51] Int. Cl.$^5$ .......................................... H03K 23/54
[52] U.S. Cl. ........................................................ 377/48
[58] Field of Search .............................................. 377/48

[56] References Cited

U.S. PATENT DOCUMENTS

| | | | |
|---|---|---|---|
| 3,928,813 | 12/1975 | Kingsford-Smith | 331/1 A |
| 4,204,174 | 5/1980 | King | 331/10 |
| 4,545,072 | 10/1985 | Skutta et al. | 455/183 |
| 4,609,881 | 9/1986 | Wells | 331/1 A |
| 4,694,475 | 9/1987 | Mehrgardt | 377/48 |
| 4,758,802 | 7/1988 | Jackson | 331/10 |
| 4,800,342 | 1/1989 | Jackson | 331/10 |
| 4,816,774 | 3/1989 | Martin | 331/1 A |
| 4,918,403 | 4/1990 | Martin | 331/1 A |
| 4,933,890 | 6/1990 | Nuytkens et al. | 364/721 |
| 4,951,237 | 9/1990 | Essenwanger | 364/721 |
| 5,021,754 | 6/1991 | Shepherd et al. | 332/128 |
| 5,038,117 | 8/1991 | Miller | 331/16 |
| 5,128,633 | 7/1992 | Martin et al. | 331/2 |

FOREIGN PATENT DOCUMENTS

| | | |
|---|---|---|
| 353399 | 2/1989 | European Pat. Off. . |
| 340870 | 5/1989 | European Pat. Off. . |
| 2188517A | 3/1986 | United Kingdom . |

OTHER PUBLICATIONS

Mathew et al., "A Review of Sigma-Delta Modulation Structures," IEEE Colloquium on 'Advanced A/D and D/A Conversion Techniques and Applications,' Digest No. 72, May 8, 1989, pp. 4/1–8.
Chou, et al., "Multistage Sigma-Delta Modulation," IEEE Transactions on Information Theory, vol. 35, No. 4, Jul. 1989, pp. 784–796.
Lewis et al., "Simulation and Modelling of Non-Linear Sampled-Data and Discrete Control Systems," IFAC Simulation of Control Systems, 1986, pp. 173–178.
Stikvoort, "Some Remarks on the Stability and Performance of the Noise Shaper or Sigma-Delta Modulator," IEEE Transactions on Communications, vol. 36, No. 10, Oct. 1988, pp. 1157–1162.
Nicholas et al., "An Analysis of the Output Spectrum of Direct Digital Frequency Synthesizers in the Presence of Phase-Accumulator Truncation," IEEE, 41st Annual Frequency Control Symposium, 1987, pp. 495–502.
Wheatley et al., "Spurious Suppression in Direct Digital Synthesizers," Proc. 35th Ann. Freq. Control Symposium, USAERADCOM, May, 1981, pp. 428–435.
Bjerede et al., "An Efficient Hardware Implementation For High Resolution Frequency Synthesis," Proc. 30th Ann. Symposium on Freq. Control, Jun. 1976, pp. 318–321.

Primary Examiner—Margaret R. Wambach

[57] ABSTRACT

A system for reducing structure spurs in multiple modulator fractional-N dividers caused by certain fractional divisors inducing an insufficiently random modulation pattern. The system sums with a first summer a fractional divisor value with an addend that changes periodically. Offset of the fractional divisor value caused by the summed addends is compensated by first subtracting the offset from the fractional divisor value with a second summer. Underflow or overflow of the fractional divisor value is accommodated by incrementing or decrementing an integer divisor value with a third summer connected in series with an integer divisor input of the multiple modulator divider.

20 Claims, 5 Drawing Sheets

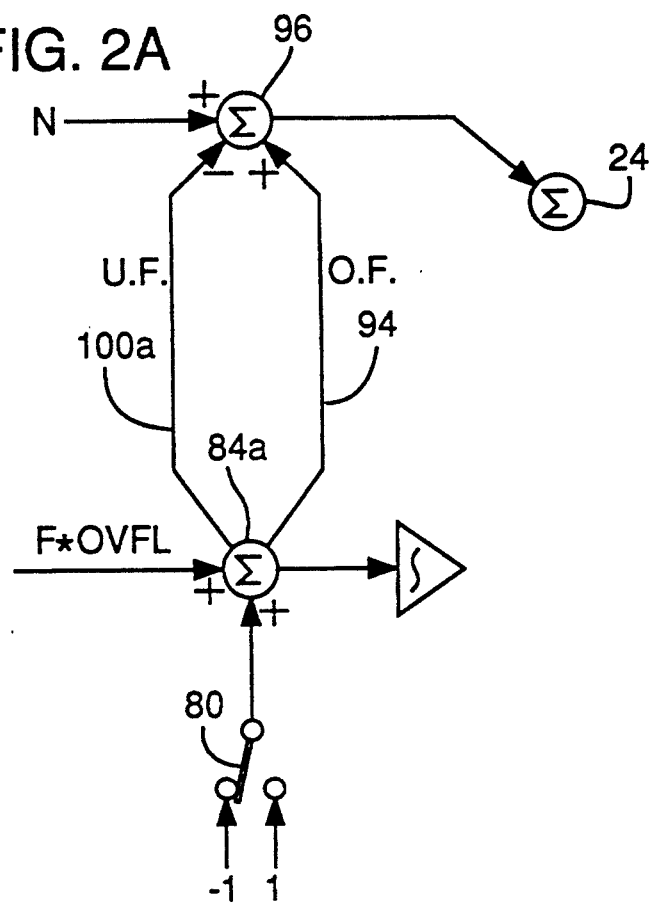

SPUR REDUCTION FOR MULTIPLE MODULATOR BASED SYNTHESIS

FIELD OF THE INVENTION

The present invention relates generally to fractional-N dividers commonly used is frequency synthesizers, and more particularly relates to fractional-N dividers which employ multiple-modulators to reduce phase "jitter" associated with the fractional-N frequency synthesis technique.

BACKGROUND AND SUMMARY OF THE INVENTION

Frequency synthesizers utilizing a phase lock loop (PLL) to provide an output signal having a selectable, precise and stable frequency are well known in the art. Typically, a PLL includes a tunable oscillator such as voltage controlled oscillator (VCO), the output of which is locked to a known reference signal by means of a phase comparator. The phase comparator generates an output voltage or current that is proportional to the phase difference between the known reference signal and the VCO output signal. The output of the phase comparator is coupled back to the input of the VCO to tune and lock the VCO to a desired frequency. This forces the VCO output to have the same frequency as the reference signal.

To provide a frequency synthesizer having a variable output frequency, a divider circuit is interposed between the output of the VCO and the phase comparator, wherein the VCO output frequency is divided by a selectable divisor before it is compared with the reference frequency. The VCO output frequency will then be an exact multiple of the referenced frequency. If the divisor, N, is an integer, the smallest increment in the VCO output frequency value is necessarily equal to the magnitude of the reference frequency itself. Thus, in order to provide a frequency synthesizer having a small step size between adjacent output frequencies, a very low reference frequency is required. However use a very low reference frequency introduces unacceptable effects such as limited frequency range and a long settling time for the PLL.

A technique known as fractional-N synthesis is often utilized to synthesize output signals having a frequency which is a rational multiple of the reference signal frequency. Typically, frequency divider circuits are implemented in such a manner that they only divide by an integer value. It is thus necessary to simulate fractional division by changing the divisor integer value temporarily during the course of a division cycle. The noninteger division ratios are realized by dividing by N+1, for example, instead of N on a proportional number of division cycles to provide an average division ratio which approximates the desired rational divisor number. For example, if the desired rational divisor is taken to be N.1, the divide value will be N for nine division cycles and N+1 for the tenth division cycle. Thus, when averaged over ten cycles the division factor equals N.1 and the VCO output frequency will be N.1 times the reference frequency. Such a fractional-N technique is disclosed in U.S. Pat. No. 3,928,813 issued to Charles A. Kingsford Smith on Dec. 23, 1975.

While such fractional-N dividers are widely used for frequency synthesis, switching between different divisor values results in undesirable phase error or phase "jitter" near the desired carrier frequency. When switching between adjacent integer divide ratios, the average divide ratio is correct, but the instantaneous divide ratio is never correct, which results in phase error at the phase detector output. This phase error phase modulates the VCO to generate spurious signals collectively known as phase jitter.

One technique for reducing jitter in a fractional-N synthesizer is disclosed in U.S. Pat. No. 5,038,117, entitled "Multiple Modulator Fractional-N Divider," issued to the inventor of the present invention on Aug. 5, 1991, the disclosure of which is incorporated herein by reference. In accordance with that technique, jitter is reduced by employing in the frequency synthesizer a multiple modulator fractional-N divider which comprises a programmable divider and a modulus control circuit. The programmable divider operates to divide the frequency output signal of the frequency synthesizer by an integer modulus value to form an intermediate frequency signal which will be compared to the reference frequency signal by the frequency synthesizer's phase comparator.

The modulus control circuit comprises a first modulator and one or more additional sigma-delta modulators arranged in cascade fashion. The circuit receives as inputs an integer divisor value and a fractional divisor value corresponding to the desired rational divisor value and provides the integer modulus value to the programmable divider. A summation circuit forms the integer modulus value as the weighted sum of all the modulator outputs. The first sigma-delta modulator, which can be implemented as an accumulator, accumulates the fractional divisor value. When the accumulator overflows, the first modulator overflow signal changes to a value of one for a single clock cycle, resulting in a corresponding increase to the integer modulus value. This varies the modulus of the programmable divider on a proportional number of division cycles to provide an average division ratio equal to the desired rational divisor number as described above.

The additional sigma-delta modulators are connected in cascade fashion to the first modulator and act to reduce the jitter associated with the fractional N division technique. Each modulator subsequent to the first acts to track out the error of the modulator that precedes it. The conditioned sum of these modulators is summed with the output signal of the first modulator to form the integer modulus value. This added modulation of the integer modulus value acts to reduce the phase jitter or fractional spurs associated with fractional-N synthesis.

Each of the additional modulators has as its input the error signal of the preceding modulator (represented by the contents of the accumulator) and accumulates the preceding modulator's error signal every clock cycle. These accumulations periodically overflow, generating an overflow signal which is taken as the output signal of the sigma-delta modulator. Each overflow signal is coupled via a summer to a differentiator circuit. For each overflow signal generated by a modulator, the differentiator generates a positive pulse and then a negative pulse in the next clock cycle. The output of the differentiator is coupled to the summer associated with the preceding sigma-delta modulator. The thus conditioned sum of the additional modulators produces a zero mean signal which acts to diminish the error present in the first modulator.

The above described multiple modulator based frequency synthesis technique is effective for reducing phase jitter associated with fractional-N synthesis (fractional spurs). However, the technique is only effective if the modulators are sufficiently random. Certain fractional divisor values, $\frac{1}{2}$ and $\frac{1}{4}$ for example, do not induce sufficient randomness. Instead a deterministic pattern of short length is produced that results in undesirable spurs in the frequency spectrum of the synthesized signal. These spurs are known as structure spurs because they are created by a lack of randomness or over-abundance of structure in the modulator's idle pattern.

Consider, for example, a three modulator fractional-N divider where $\frac{1}{2}$ is used as the fractional divisor value. Table 1 below shows the values accumulated in the integrators of the three modulators assuming an initial accumulated value of zero in each integrator. Notice that a pattern forms which repeats every four clock cycles. As a result, when the modulator is used in a frequency synthesizer under these conditions, structure spurs will be created at frequencies of $\frac{1}{4}$ and $\frac{1}{2}$ of the frequency synthesizer's reference frequency.

TABLE 1

| Ref. Cycle | Accum 1 | Ovfl 1 | Accum 2 | Ovfl 2 | Accum 3 | Ovfl 3 |
|---|---|---|---|---|---|---|
| 0 | 0 | 0 | 0 | 0 | 0 | 0 |
| 1 | .5 | 0 | .5 | 0 | .5 | 0 |
| 2 | 0 | 1 | .5 | 0 | 0 | 1 |
| 3 | .5 | 0 | 0 | 1 | 0 | 0 |
| 4 | 0 | 1 | 0 | 0 | 0 | 0 |
| 5 | .5 | 0 | .5 | 0 | .5 | 0 |
| . | . | . | . | . | . | . |

Structure spurs can be dealt with in several ways. First, one could simply avoid frequency synthesis of frequencies that have excessive structure spurs. However, avoiding synthesis of certain frequencies can be done only at the expense of system flexibility. A second option would be to seed the integrators with starting values that tend to randomize modulator operation at the expense of arbitrary phase control. A third possibility is that of narrowing the bandwidth of the frequency synthesizer's phase locked-loop to filter all objectionable structure spurs. This last option, however, is done at the expense of switching speed and phase noise.

The present invention provides a simple method for reducing structure spurs. In accordance with the present invention, two or more numbers (addends) are alternately added to the fractional divisor value before it is input to the multiple modulator fractional-N divider. For example, in a particular embodiment of the invention, the numbers 0 and 2 are alternately added to the fractional divisor value. This causes the limit cycle of the cascaded modulators to have maximum length, thus destroying the short term periodicity associated with certain fractional divisor values which create structure spurs.

If the means of the alternating addends is not zero, the fractional divisor value will be offset. In the embodiment described above where the addends are 0 and 2, the fractional divisor value will be offset by 1. If such an offset exists, it is necessary to also subtract the offset from the fractional divisor value before it is input to the multiple modulator fractional-N divider.

Underflow and overflow of the fractional divisor value when the addend is added and the offset subtracted must also be accommodated. Overflow can be accommodated by incrementing the integer divisor value by one. Underflow can be accommodated by decrementing the integer divisor value by one.

Implementation of the structure spur reduction technique is simple. A summer circuit connected in series with the fractional divisor value input of the multiple modulator fractional-N divider can be used to perform the addition of alternate addends. Alternating selection of the addends can be performed by a switch connected to the summer. A second summer circuit connected in series with the fractional divisor value input can perform the subtraction of the offset. Incrementing and decrementing of the integer divisor value to accommodate offsets can be performed by a third summer circuit connected in series with the integer divisor input.

Additional features and advantages of the present invention will be made apparent from the following detailed description of a preferred embodiment, which proceeds with reference to the accompanying drawings.

BRIEF DESCRIPTION OF THE DRAWINGS

FIGS. 2 and 2A are block diagrams of a multiple modulator fractional-N divider with structure spur reduction in accordance with a preferred embodiment of the present invention.

DETAILED DESCRIPTION OF THE PREFERRED EMBODIMENT

Figure 1:
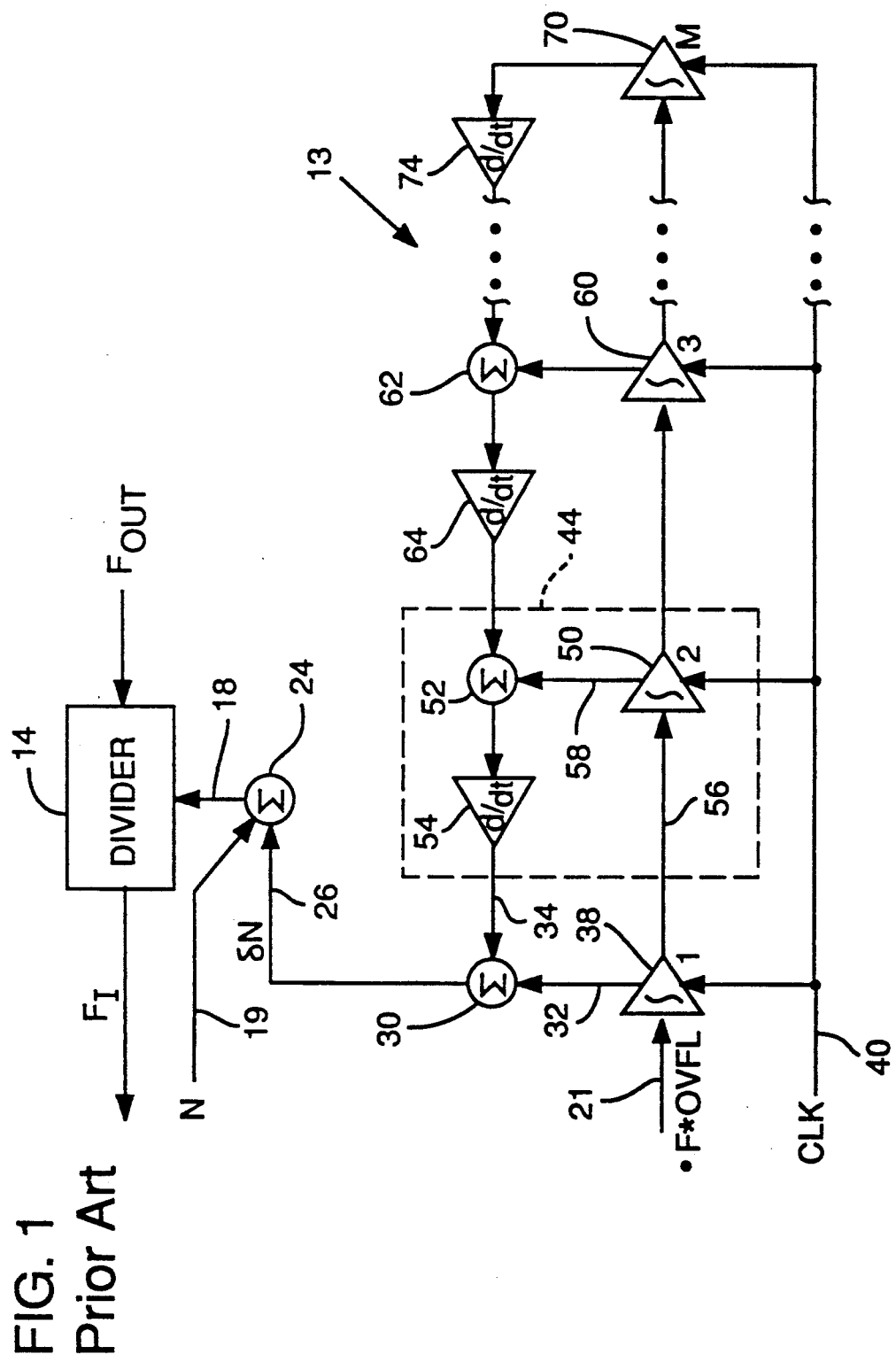
FIG. 1 is a block diagram of a prior art multiple modulator fractional-N divider.

With reference to FIG. 1, a multiple modulator fractional-N divider (hereinafter referred to as the multiple modulator divider) 13 as disclosed in the above described U.S. Pat. No. 5,038,117 is shown. The multiple modulator fractional-N divider 13 is intended primarily for use in a frequency synthesizer. However, use of the multiple modulator fractional-N divider is not limited to frequency synthesis. In a frequency synthesizer having a phase-locked loop configuration, the multiple modulator fractional-N divider is commonly connected between a tunable oscillator and a phase comparator. This allows the frequency synthesizer to synthesize a frequency output signal having a frequency which is the product of a reference frequency and a rational number.

The multiple modulator fractional-N divider 13 acts to divide the frequency of the frequency output signal of the tunable oscillator by a desired rational divisor value. The desired rational divisor value has an integer portion (N) and a fractional portion (.F). The multiple modulator fractional-N divider 13 comprises a programmable divider 14 which divides the frequency output signal ($F_{OUT}$) by an integer modulus value to produce an intermediate frequency ($F_I$). The programmable divider 14 is operative to divide a frequency signal by integer numbers only, but the modulus of the programmable divider can be varied. The integer modulus value is generated by the remainder of the circuitry in the multiple modulator fractional-N divider and provided to the programmable divider on line 18. This circuitry may be considered a modulus control circuit of the programmable divider.

The integer modulus value is produced based on two other inputs to the multiple modulator fractional-N divider 13. An integer divisor value is received at an integer divisor input 19 to the multiple modulator fractional-N divider. The integer divisor value corresponds to the integer portion of the desired rational divisor value. A fractional divisor input 21 receives a fractional divisor value corresponding to a fractional portion (F) summed with two signals as described below. A summer 24 produces the integer modulus value as the sum of the integer divisor value and a modulus control signal on line 26 and outputs the integer modulus value on line 18 to the programmable divider 14. The modulus control signal on line 26 is formed by a summer 30 as the sum of a first modulator output signal on line 32 and a conditioned sum of subsequent modulator outputs on line 34.

The fractional divisor value received at fractional divisor input 21 drives a first sigma-delta modulator, which may be implemented as an accumulator, depicted in FIG. 1 as an integrator. The accumulator is clocked by a clock signal on line 40. Generally, the intermediate frequency signal produced by the programmable divider is used as the clock signal. The first integrator 38 accumulates the fractional divisor value by adding the fractional divisor value to an accumulated value each cycle of the clock signal. Periodically, the accumulated value in the first integrator exceeds an overflow value. Whereupon, the first integrator 38 produces a first sigma-delta modulator output signal on line 32. The overflow threshold of the integrator 38 in the illustrated multiple modulator fractional-N divider 13 is a fixed value. The integrator 38 could also be implemented to receive an input threshold value, allowing setting of the overflow threshold by a user. However, such an implementation would be more complex.

When there is no overflow of the integrator 38, the sigma-delta modulator output signal on line 32 has a value of zero. However, when there is an overflow, the first sigma-delta modulator output signal (line 32) has a value of one. As described above, the integer modulus value formed by summers 24, 30 is the sum of the integer divisor value, the first modulator output signal and the conditioned sum of all subsequent sigma-delta modulator outputs. Thus, ignoring the signal from the subsequent modulators, the integer modulus value is equal to the integer divisor value on those clock cycles during which there is no overflow of the first integrator 38 and equal to the integer divisor value plus one when there is an overflow. The proportion of clock cycles on which a first modulator output signal is generated to the total clock cycles is equal to the ratio of the fractional divisor value to the overflow value. This corresponds to the fractional portion (.F) of the desired rational divisor value. Consequently, the average value of the integer modulus value is exactly equal to the desired rational divisor value.

The multiple modulator fractional-N divider 13 also comprises a series of cells 44 connected in cascade fashion to the first integrator. Each cell 44 is identical in operation and comprises a sigma-delta modulator 50 (implemented as an accumulator and illustrated as an integrator), a summer 52, and a differentiator 54. In the illustrated multiple modulator fractional-N divider, there are three cells shown. However, any desired number of cells may be provided. In the last cell, comprising integrator 70 and differentiator 74, a summer is omitted. Each of the integrators 50, 60, 70 is implemented as a clocked accumulator and is connected to the output of the preceding integrator. An overflow output of each integrator 50, 60, 70 is coupled to an input of their respective cell's differentiator 54, 64, 74. The output of each differentiator is added to the sigma-delta modulator output of the preceding cell by the summers 52, 62.

With reference to the cell 44, the integrator 50 is clocked by the clock signal on line 40. On each cycle of the clock signal, the integrator accumulates the accumulated value from the preceding integrator, integrator 38. The integrator 50 overflows when its accumulated value exceeds an overflow value. The overflow value of the integrator 50 is preferably the same as the overflow value for the integrator 38. When an overflow occurs, the integrator 50 generates a positive pulse in an overflow signal on line 58. The positive pulse may be implemented as a change in value of the signal to a one for a clock cycle in which there is an overflow, and remaining at a value of zero when there is no overflow.

The overflow signal from the integrator 50 is coupled to the differentiator 54 via the summer 52. The summer 52 adds the output of the subsequent cell to the overflow signal of the integrator 50. The differentiator 54 differentiates this sum. Thus, when the summed signals from the summer 52 makes a positive transition, such as when the integrator 50 overflows creating a zero to one transition of its overflow signal, the differentiator 54 generates a positive pulse in its output signal. When the value of the summed signals again returns to zero in a subsequent clock cycle, the differentiator generates a negative pulse in its output signal. The output of differentiator 54, therefore, is a zero-mean signal. This signal is summed with the integer divisor value and the output signal of the first sigma-delta modulator to form the integer modulus value. The weighted sum of the additional sigma-delta modulators 34 provides a zero mean modulation of the integer modulus value to reduce jitter or spurs associated with fractional-N division without altering the average value of the integer modulus value.

Figure 2:
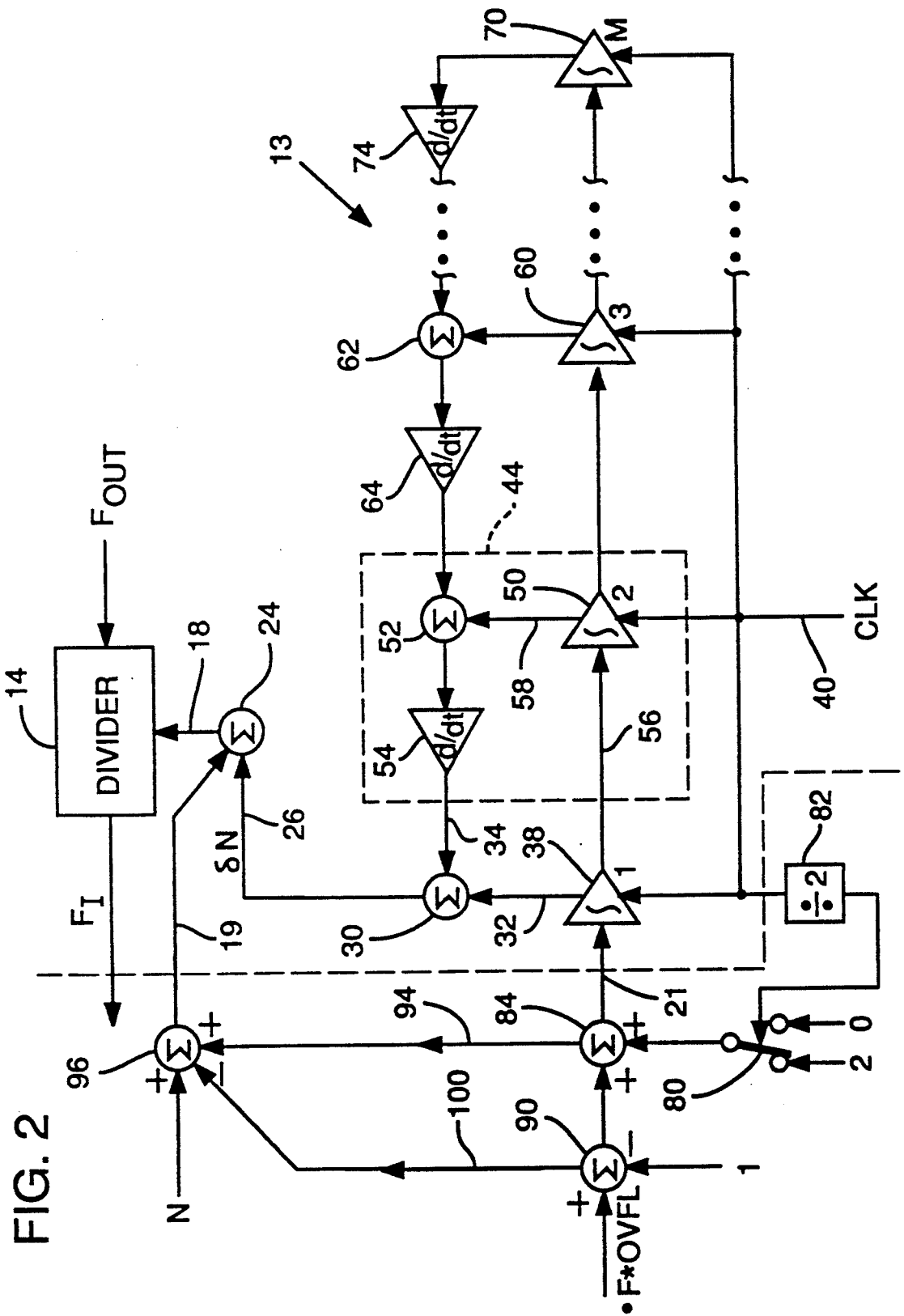

As described in the background of the invention, this multiple modulator fractional-N divider creates structure spurs in a frequency synthesizer when used with fractional divisor values that do not induce sufficient randomness. With reference to FIG. 2, in accordance with a preferred embodiment of the present invention, structure spurs in the multiple modulator fractional-N divider 13 are eliminated by alternately adding the values 0 and 2 to the fractional divisor value at the fractional divisor input 21.

In FIG. 2, alternate addition of the values 0 and 2 to the fractional divisor value is performed by a switch 80, a divide-by-2 divider 82, and a summer 84. The switch 80 selects one of the two values 0 and 2. The divider 82 is connected between the clock line 40 of the multiple modulator fractional-N divider 13 and the switch 80. The divider 82 divides the frequency of the clock signal by half to produce a switching signal. The switching signal causes the switch 80 to alternate selection of one then the other of the values 0 and 2 at half the clock frequency.

The value selected by the switch 80 is received at an input of the summer 84. The summer 84 is connected in series with the fractional divisor input 21 and receives the fractional divisor value at its second input. The summer 84 adds the selected value and the fractional divisor value and outputs the result to the fractional divisor input 21.

Alternately adding 0 and 2 to the fractional divisor value creates an offset of 1 at the fractional divisor input 21. The offset is compensated in advance by a summer 90 connected in series with the summer 84 to the fractional divisor input. The summer 90 subtracts the offset of 1 from the fractional divisor value so that the average value at the fractional divisor input 21 is equal to the fractional divisor value.

With some fractional divisor values, the addition performed by the summer 84 may result in an overflow condition where the sum of the fractional divisor value and one of the values 0 and 2 exceed the overflow value of the integrator 38. Overflow of the fractional divisor value is accommodated by generating an overflow signal on line 94 having a value of 1 when an overflow condition exists and a value of 0 when there is no overflow. A summer 96 connected in series with the integer divisor input 19 adds the overflow signal generated by summer 84 to the integer divisor value.

With some fractional divisor values, the subtraction performed by the summer 90 may result in an underflow condition when the fractional divisor value minus the offset value is less than zero. To accommodate underflow, the summer 90 generates an underflow signal on line 100 having a value of 1 when an underflow condition exists and a value of 0 when there is no underflow. This underflow signal is subtracted from the integer divisor value by the summer 96.

In alternate embodiments of the present invention, a different set of values may be selected by the switch 80 to be added to the fractional divisor value in summer 84. For example, the values −1 and +1 can be used. In such a case, there is no offset of the fractional divisor value created. However, since the addition of −1 to the fractional divisor value in summer 84 could result in underflow, appropriate underflow compensation must be made. A suitable system is shown in the circuit excerpt of FIG. 2A. In this arrangement, the fractional divisor value is input directly to a summer 84a (there being no need to compensate by subtracting an offset, as was done by block 90 in FIG. 2). Summer 84a has an overflow output 94 as in FIG. 2, but additionally has an underflow output 100a. The latter provides an output signal when, for example, a fractional divisor value of 0 is summed with a value of −1 from switch 80. The overflow and underflow signals on lines 94 and 100a are combined with the integer divisor value input in summer 96, as in FIG. 2.

It will be recognized that still other sets of alternating values can be used, including a set of more than two numbers selected in sequence. A psuedo-random sequence has also been successfully employed. Any offset caused by such other sets of values would have to be subtracted by the summer 90, and overflow and underflow accommodated at the summer 96.

The spur reduction system of the present invention can be implemented using external hardware connected to a multiple modulator fractional-N divider 13. The spur reduction hardware could also be incorporated with the multiple modulator fractional-N divider 13 in a single integrated circuit. The preferred embodiment, however, is to implement at least a portion of the spur reduction functionality shown by the circuit blocks of FIG. 2 in software, rather than hardware. In particular, summer 90, and the portion of summer 96 that combines the underflow signal on line 100 with the integer divide value N, are desirably implemented by software routines that execute the summation functions represented in FIG. 2. Accordingly, in construing the claims, it should be understood that elements described as hardware components should be construed literally to include software counterparts thereto.

Figure 3:
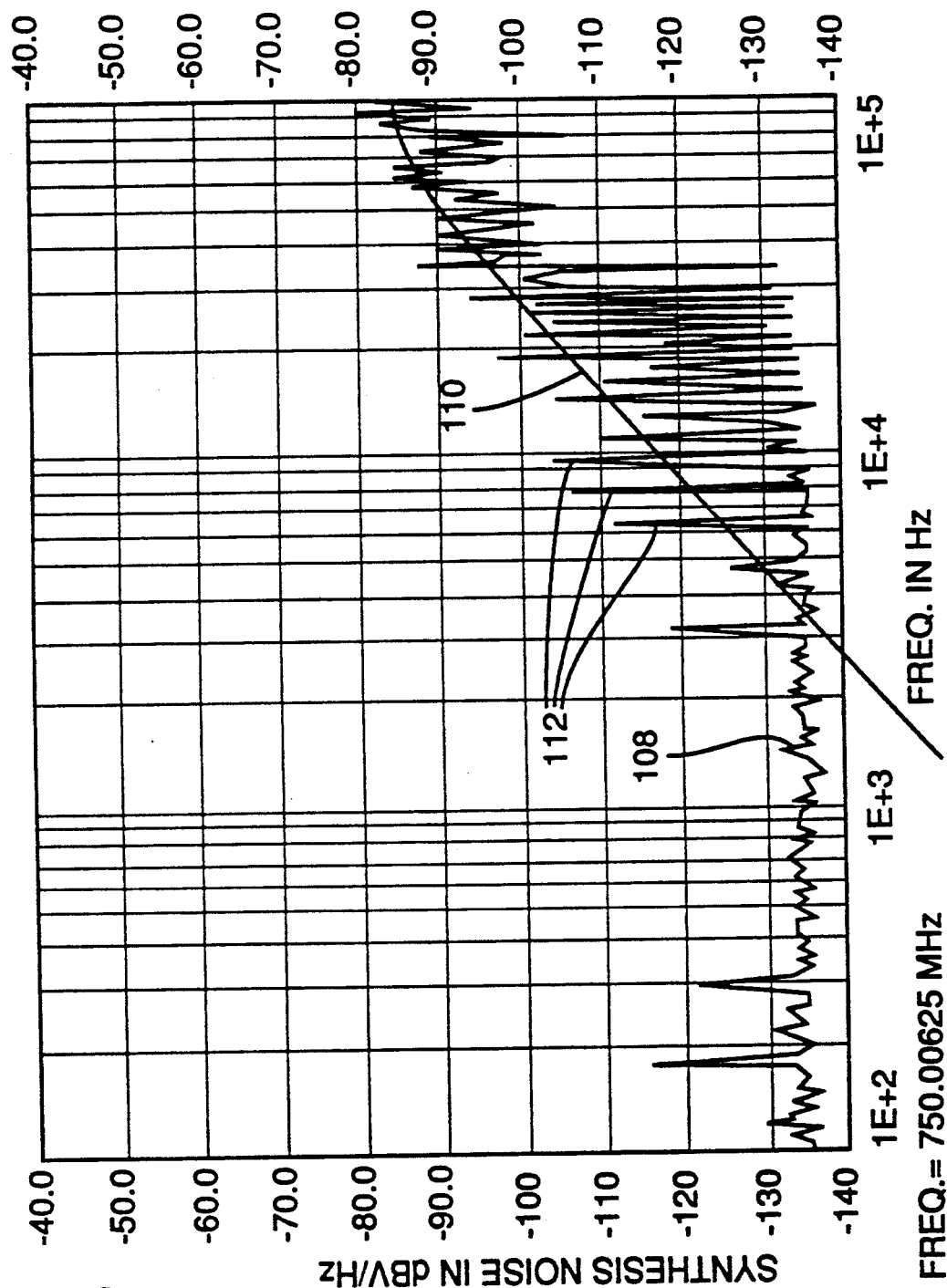
FIG. 3 is a graph of the synthesis noise displaying the structure spurs associated with the prior art multiple modulator fractional-N divider of FIG. 1.

FIG. 3 is a graph of the synthesis noise (line 108) produced by a frequency synthesizer using a multiple modulus fractional-N divider such as that shown in FIG. 1 without spur reduction circuitry. A fractional divisor value corresponding to the fraction 1/64 was used. The line 110 is the expected synthesis noise of the frequency synthesizer using an ideal divider. The synthesis noise 108 has numerous structure spurs 112 with significant amplitude.

Figure 4:
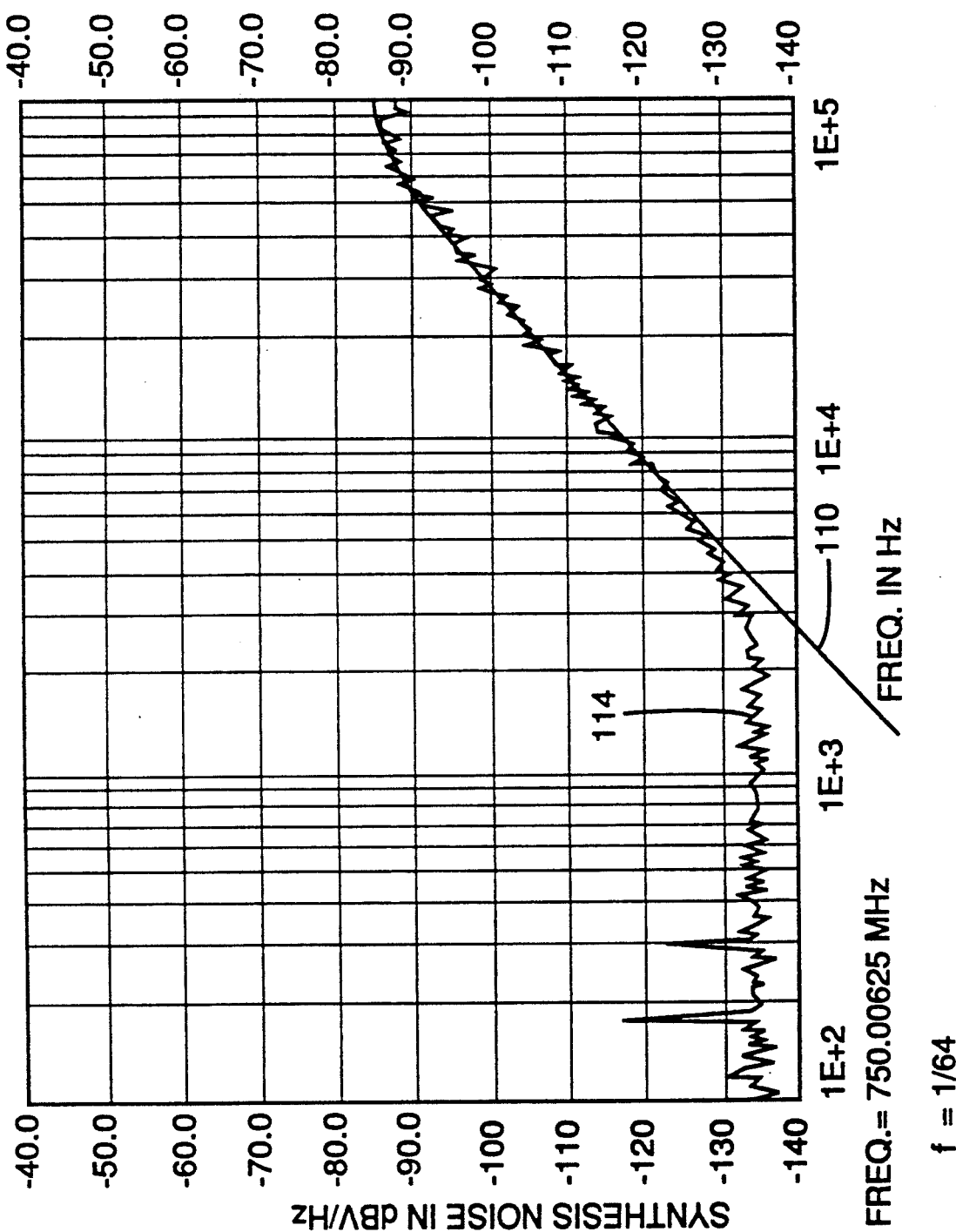
FIG. 4 is a graph of the synthesis noise associated with the multiple modulator fractional-N divider with structure spur reduction of FIG. 2.

Compare to FIG. 4 which shows a graph of the synthesis noise 114 produced by a frequency synthesizer using a multiple modulator fractional-N divider with spur reduction circuitry according to the preferred embodiment of the present invention. The same fractional divisor value was used. The structure spurs 112 have, for the most part, been eliminated. With the spur reduction technique of the present invention, the synthesis noise 114 of the multiple modulator fractional-N divider more closely approximates the synthesis noise 110 of an ideal divider.

Having described and illustrated the principles of my invention with reference to a preferred embodiment, it will be recognized that the invention can be modified in arrangement and detail without departing from such principles. Accordingly, I claim as my invention all such embodiments as may come within the scope and spirit of the following claims and equivalents thereto.

I claim:

1. In a multiple modulator fractional-N divider comprising:

a fractional divisor input for receiving a fractional divisor value;

an integer divisor input for receiving an integer divisor value;

an integrator connected to the fractional divisor input for accumulating the fractional divisor value and, when an overflow value is exceeded, for generating an integrator overflow signal;

at least one modulator coupled to the integrator in cascade fashion for producing a modulator signal; and a programmable divider for dividing a first frequency signal by a modulus value equal to the sum of at least the integer divisor value, the integrator overflow signal, and the modulator signal to form a second frequency signal, an improvement for eliminating structure spurs caused by insufficiently random modulators comprising:

first summation means connected in series with the fractional divisor input for adding a changing value to the fractional divisor value at the fractional divisor input.

2. The multiple modulator fractional-N divider of claim 1 wherein the first summation means includes means for repetitively and alternately adding a first alternate value and then a second alternate value to the fractional divisor value at the fractional divisor input.

3. The multiple modulator fractional-N divider of claim 2 wherein the first summation means comprises:

a first adder connected in series with the fractional divisor input of the multiple modulator fractional-N divider, the first adder having first and second inputs and a sum output, the first adder being operative to receive the fractional divisor value at the first input and an alternating value at the second input and to yield at the sum output the fractional divisor value summed with the alternating value; and switch means connected to the second input of the first adder and operative to repetitively and alternately select in synchronization with a switching signal the first then the second alternate values as the alternating value.

4. The multiple modulator fractional-N divider of claim 3 wherein the first alternate value is −1 and the second alternate value is +1.

5. The multiple modulator fractional-N divider of claim 3 wherein the first adder has an overflow output and is operative to generate at the overflow output a summation overflow signal when the sum of the fractional divisor value and the alternating value exceeds the overflow value.

6. The multiple modulator fractional-N divider of claim 5 comprising second summation means coupled to the first summation means, the modulator, and the programmable divider for summing the integer divisor value, the summation overflow signal, the integrator overflow signal, and the modulator signal to form the modulus value.

7. The multiple modulator fractional-N divider of claim 5 wherein the first adder has an underflow output and is operative to generate at the underflow output a summation underflow signal when the sum of the fractional divisor value and the alternating value is less than zero.

8. The multiple modulator fractional-N divider of claim 7 comprising second summation means coupled between the first summation means and the programmable divider for summing the integer divisor value, the summation overflow signal, the summation underflow signal, the integrator overflow signal, and the modulator signal to form the modulus value.

9. The multiple modulator fractional-N divider of claim 3 comprising a clock divider connected to the switch means and to a clock line of the multiple modulator fractional-N divider to produce the switching signal with a frequency equal to a fraction of the frequency of a clock signal on the clock line.

10. The multiple modulator fractional-N divider of claim 3 comprising third summation means connected in series with the fractional divisor input, the third summation means having a first input for receiving the fractional divisor value, a second input for receiving an offset value, a summation output for yielding the fractional divisor value summed with the offset value, and an underflow output for generating a summation underflow signal when the sum of the fractional divisor value and the offset value are less than zero.

11. The multiple modulator fractional-N divider of claim 10 wherein the first alternate value is 0, the second alternate value is 2, and the offset value is −1.

12. The multiple modulator fractional-N divider of claim 10 wherein the underflow output of the third summation means provides the summation underflow signal to the second summation means, and the summation output of the third summation means provides the the summed fractional divisor value to the first summation means.

13. A spur reduction system for a multiple modulation fractional-N divider having a fractional divisor input for receiving a fractional divisor value and an integer divisor input for receiving an integer divisor value, the spur reduction system including:

a first summer connected in series with the fractional divisor input for summing the fractional divisor value with a changing value.

14. The spur reduction system of claim 13 in which:

the first summer sums the fractional divisor value with an alternating value; and which further comprises:

a switch having an output connected to the summer for alternately selecting in synchronization with a switching signal between at least a first alternate value and a second alternate value to form the alternating value.

15. The spur reduction system of claim 14 wherein:

the first summer has an overflow output driven with an overflow signal when the sum of the fractional divisor value plus the alternating value exceeds an overflow value, and an underflow output driven with an underflow signal when the sum of the fractional divisor plus the alternating value is less then zero;

the spur reduction system further comprising a second summer connected in series with the integer divisor input for summing the integer divisor value with the overflow signal and the underflow signal.

16. The spur reduction system of claim 14 wherein the first summer has an overflow output driven with an overflow signal when the sum of the fractional divisor value plus the alternating value exceeds an overflow value;

the spur reduction system further comprising:

a second summer connected in series with the fractional divisor input for summing the fractional divisor value and an offset value, the second summer having an underflow output driven with an underflow signal when the sum of the fractional divisor value plus the offset value is less than zero; and a third summer connected in series with the integer divisor input for summing the integer divisor value with the overflow signal and the underflow signal.

17. The spur reduction system of claim 14 comprising a clock divider connected between a clock line of the multiple modulator fractional-N divider and the switch for dividing a clock signal on the clock line to form the switching signal.

18. A method of reducing structural spurs in a multiple modulator fractional-N divider system, the system having a fractional divisor input for receiving a fractional divisor value and an integer divisor input for receiving an integer divisor value, the method comprising:

alternately selecting a value from at least first and second alternate values;

adding the alternating value to the fractional divisor value;

when the sum of the alternating value plus the fractional divisor value exceeds an overflow value, adding +1 to the integer divisor value; and when the sum of the alternating value plus the fractional divisor value is less than zero, adding −1 to the integer divisor value.

19. The method of claim 18 comprising:

subtracting an offset value equal to the average of the alternating value from the fractional divisor value; and when the fractional divisor value minus the offset value is less then zero, adding −1 to the integer divisor value.

20. The method of claim 18 which includes alternately selecting said values at a rate less than or equal to a clock rate of the multiple modulator fractional-N divider.

* * * * *